US009263129B2

(12) United States Patent
Cabout et al.

(10) Patent No.: US 9,263,129 B2
(45) Date of Patent: Feb. 16, 2016

(54) METHOD FOR DETERMINING PROGRAMMING PARAMETERS FOR PROGRAMMING A RESISTIVE RANDOM ACCESS MEMORY

(71) Applicant: Commissariat à l'énergie atomique et aux énergies alternatives, Paris (FR)

(72) Inventors: Thomas Cabout, Grenoble (FR); Elisa Vianello, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/713,127

(22) Filed: May 15, 2015

(65) Prior Publication Data
US 2015/0332764 A1 Nov. 19, 2015

(30) Foreign Application Priority Data

May 15, 2014 (FR) .................................... 14 54346

(51) Int. Cl.
G11C 11/00 (2006.01)
G11C 13/00 (2006.01)

(52) U.S. Cl.
CPC ........ *G11C 13/0069* (2013.01); *G11C 13/0007* (2013.01); *G11C 13/0011* (2013.01)

(58) Field of Classification Search
CPC ...................................................... G11C 11/00
USPC ........................................ 365/148, 158, 163
See application file for complete search history.

(56) References Cited

U.S. PATENT DOCUMENTS

| 2008/0094876 | A1* | 4/2008 | Siau | G11C 11/16 365/148 |
| 2008/0144354 | A1* | 6/2008 | Choi | H01L 21/2256 365/148 |
| 2008/0170427 | A1* | 7/2008 | Choi | H01L 45/1226 365/148 |
| 2009/0109727 | A1* | 4/2009 | Fang | G11C 13/0007 365/148 |
| 2009/0296449 | A1* | 12/2009 | Slesazeck | G11C 5/02 365/148 |

(Continued)

OTHER PUBLICATIONS

Preliminary Search Report as issued in French Patent Application No. 1454346, dated Mar. 9, 2015.

(Continued)

Primary Examiner — Harry W Byrne
(74) Attorney, Agent, or Firm — Pillsbury Winthrop Shaw Pittman LLP

(57) ABSTRACT

A method for determining programming parameters for programming a resistive random access memory switching from an OFF state to an ON state, the method including determining retention curves representing the increase in the ON state resistance as a function of time, for a given programming temperature and a given current limitation; determining a retention failure time for each of the retention curves; determining curves representing the decrease in the retention failure time as a function of the programming temperature, for a given current limitation; for at least one given programming temperature, determining, from the curves representing the decrease in the retention failure time, a current limiting value to be applied to the resistive random access memory in order to obtain a target retention failure time.

9 Claims, 5 Drawing Sheets

(56) References Cited

U.S. PATENT DOCUMENTS

| | | | |
|---|---|---|---|
| 2011/0007551 A1* | 1/2011 | Tian | G11C 11/16 365/148 |
| 2011/0170331 A1* | 7/2011 | Oh | G11C 13/0002 365/148 |
| 2011/0170335 A1* | 7/2011 | Khoury | G11C 13/0002 365/148 |
| 2011/0235401 A1 | 9/2011 | Kunitake et al. | |
| 2011/0305064 A1* | 12/2011 | Jo | G11C 13/0002 365/148 |
| 2011/0305066 A1* | 12/2011 | Nazarian | G11C 13/0064 365/148 |
| 2011/0317472 A1* | 12/2011 | Awaya | G11C 11/16 365/148 |
| 2012/0008366 A1* | 1/2012 | Lu | G11C 13/0002 365/148 |
| 2012/0020140 A1* | 1/2012 | Chen | G11C 11/22 365/148 |
| 2012/0092919 A1* | 4/2012 | Hirose | H01L 45/147 365/148 |
| 2012/0092920 A1* | 4/2012 | Hirose | G11C 11/5685 365/148 |
| 2012/0327701 A1* | 12/2012 | Nazarian | G11C 11/5678 365/148 |

OTHER PUBLICATIONS

Chen et al., "Improvement of data retention in $HfO_2$/Hf 1T1R RRAM cell under low operating current," 2013 IEEE International Electron Devices Meeting, XP055173058.

* cited by examiner

US 9,263,129 B2

METHOD FOR DETERMINING PROGRAMMING PARAMETERS FOR PROGRAMMING A RESISTIVE RANDOM ACCESS MEMORY

CROSS-REFERENCE TO RELATED APPLICATIONS

This application claims priority to French Patent Application No. 1454346, filed May 15, 2014, the entire content of which is incorporated herein by reference in its entirety.

FIELD

The present invention relates to the field of non-volatile rewritable memories, and more specifically that of OxRRAM and CBRAM type resistive random access memories. A resistive random access memory comprises first and second electrodes separated by a layer of an electrically insulating material, and switches from an OFF (High resistive state) state to an ON (Low resistive state) state by applying a threshold voltage VSET between the first and second electrodes.

BACKGROUND

Depending on the applications and performance aimed at, different types of memories are used.

Thus, SRAM type memories, or static random access memories, offer ultra-fast write times, required for example during the computations by a microprocessor. The major drawback of these memories is that they are volatile and that the relatively large size of the memory element does not enable a high storage capacity to be obtained in a moderate volume.

The DRAM type memories, or dynamic random access memories, which perform the storage of electric charges in capacitors, offer a large storage capacity. These memories, however, have higher write times (a few tens of nanoseconds) than those of SRAM type memories and are also volatile, the information retention time being in the order of a few tens of milliseconds.

Conversely, for applications which require an information storage even when the voltage is shut off, solid state memory devices are also known which preserve information in the absence of power supply: these devices are called non-volatile memories. Thus, for numerous years, different technological solutions have been developed, and have led to the availability of non-volatile memories that can be electrically written and erased. For example, mention might be made of the following:

EPROMs ("Erasable Programmable Read Only Memories"), the content of which can be electrically written, but which have to be subjected to a UV radiation to erase stored information;

EEPROMs ("Electrically Erasable Programmable ROMs"), the content of which can be electrically written and erased, but which require, for being manufactured, semiconductor areas larger than EPROM type memories, and which are therefore more expensive to make.

Given that the two above mentioned solutions have a limited application, the manufacturers have been searching for an ideal non-volatile memory, which would combine the following characteristics: electrical writing and erasing, high density and low cost per bit, random access, short write and read times, good endurance, but also low power consumption and low supply voltage.

There are also non-volatile memories, called Flash memories, which do not have the aforementioned drawbacks of EPROM or EEPROM memories. Indeed, a Flash memory is formed by a plurality of memory cells that can be individually electrically programmed, wherein a great number of cells, called a block, a sector, or a page, can be simultaneously electrically erased. Flash memories combine both the advantage of EPROM memories in terms of integration density and the advantage of EEPROM memories in terms of electrical erasing.

Moreover, the durability and low electric power consumption of Flash memories make them interesting for numerous applications: digital cameras, cell phones, printers, personal assistants, laptop computers, or even portable sound reading and recording devices, USB keys, etc. Moreover, Flash memories do not have mechanical elements, which provides them with a quite high impact resistance. In the "all-digital" age, these products have been largely developed, allowing a boom in the market of Flash memories.

Most commercial non-volatile Flash memories use charge storage as a principle for information coding. In practice, a charge trapping layer (generally of polysilicon, or a dielectric such as SiN) is packaged between two dielectrics in the gate stack of a MOS transistor. The presence or absence of charge in this medium modifies the conduction of the MOS transistor and enables the memory state to be coded.

More recently, other types of rewritable non-volatile memories have emerged to reduce voltages and programming times of Flash memories; mention might be made in particular of ferroelectric memories (FeRAM, "Ferroelectric RAM" memories), based on bias switchover, or magnetic memories (MRAM memories or "Magnetic RAM") which use the direction of the residual magnetic field in the active material. However, FeRAM and MRAM memories have difficulties which restrict their downsizing.

In order to overcome these difficulties, variable resistance memories (called RRAM, "Resistive RAM" memories) are known; the latter attract much attention nowadays. The resistive type memories can have at least two states, "off" or "on", corresponding to switching from a resistive state ("HRS" state) to a less resistive state ("LRS" state).

Variable resistance random access memories are attracting much attention nowadays, in particular due to their low electric power consumption and high operating rate.

The binary data 0 or 1 are stored in a metal/insulator/metal (MIM) structure having two distinct resistance states. FIG. 1 represents the structure of a MIM type RRAM memory cell 1. This device 1 is formed by a stack including an active storage area 2 provided between a lower conducting electrode 3 and an upper conducting electrode 4.

Thus, the resistive type memory cell can reversibly switch over from a high resistance state "HRS", also called "OFF" state, to a low resistance state ("LRS") or "ON" state. Therefore, it can be used to store binary information.

The write mechanism is called SET within the scope of RRAMs and consists in switching from the HRS state to the LRS state. To erase information, the active material is switched from the LRS state to the HRS state, the erase mechanism being called RESET. The LRS and HRS states are both conducting (of course with a better conduction of the LRS state in comparison to the HRS state); but in the initial state, the active material of the active storage area 2 is insulating (PRS ("Pristine Resistance State") state). A first electrical stress thus has to be applied to the virgin memory cell in order to generate the LRS state for the first time. The associated process, called FORMING, consists of a partially reversible breakdown of the active material, that is after switching from the PRS insulating OFF state to the LRS conducting ON state, the resistance of the conducting ON state can be switched over to the HRS state with a lower electrical stress (RESET operation).

The resistance changing phenomenon is observed in different types of materials, which suggests different operating mechanisms. Thus, several types of resistive memories can be distinguished.

The field of the present invention more particularly relates to two categories of resistive memories:
- the memories including an active area based on an oxide-based active material (OxRRAM memory or "Oxide RRAM") such as a binary oxide of a transition metal;
- the memories including an active area based on an ion conducting material (CBRAM memories or "Conductive Bridging RAM") forming a ion conducting solid electrolyte provided between an electrode forming an inert cathode and an electrode including a ionisable metal portion, that is a metal portion that can readily form metal ions, and forming an anode.

The operation of CBRAM memories is based on the formation, within the solid electrolyte, of one or more metal filaments (also called "dendrites"), between its two electrodes when these electrodes are brought to appropriate potentials. The filament formation allows a given electrical conduction to be achieved between both electrodes. By modifying the potentials applied to the electrodes, it is possible to modify the filament distribution, and thus to modify the electrical conduction between both electrodes. For example, by inversing the potential between the electrodes, it is possible to do away with or reduce the metal filament, so as to remove or dramatically reduce the electrical conduction due to the presence of the filament. In the "HRS" state, metal ions from the ionisable metal portion of the soluble electrode are dispersed in the entire solid electrolyte. Thus, no electrical contact is set between the cathode and the anode, that is between the upper electrode and the lower electrode. The solid electrolyte includes a high resistivity electrically insulating area between the anode and the cathode. When a positive VSET potential is applied to the anode, a redox reaction occurs at this electrode, creating mobile ions. The ions then move in the electrolyte under the effect of the electric field applied to the electrodes. When arrived at the inert electrode (the cathode), the ions are reduced, causing the growth of a metal filament. The filament preferentially grows in the direction of the soluble electrode. The memory then switches to the "LRS" state when the filament allows contact between the electrodes, making the stack conducting. This phase makes up the "SET" of the memory.

To switch to the "HRS" state ("RESET" phase of the memory), a negative VRESET voltage is applied to the anode, causing the dissolution of the conducting filament.

As regards OxRRAM memories, as for the CBRAM memories, the filament model is widely consensual. Therefore, it also relies on the formation and breaking of one or more conduction paths (conducting filaments) in the oxide matrix, connecting both electrodes. The formation and breaking of conducting filaments are ascribed to the presence of oxygen vacancies.

It is important to note that, in the case of OxRRAMs as in the case of CBRAMs, the SET operation enables the memory cell to be switched from a HRS high resistance state to a LRS low resistance state. As discussed above, the SET is made by applying a sufficient voltage VSET at the terminals of the memory element. The transition between the high and low resistance states (close to an oxide breakdown in the case of an OxRRAM memory) is very fast and results in a sharp current increase when the VSET voltage is reached. This increase is illustrated in FIG. 2. This sharp current increase is not auto-restricted. If nothing is made to control this increase, the current will increase up to very high values likely to cause a very high temperature increase and a destruction of the memory device. Therefore, it is desirable to restrict by compliance the current increase up to some value in order to achieve a low resistance state while keeping a memory device safe. This restricted current is indifferently called current limitation or current compliance.

The current limitation during the write operation can be made by different means such as a resistance or a transistor in series with the memory: adding a resistance or a transistor in series enables the current passing through the memory element and series resistance/transistor assembly to be limited.

The use of a resistance R (illustrated in FIG. 3) put in series with the memory element (herein an OxRRAM memory) enables the current to be limited. The presence of the series resistance enables the current which passes through the assembly to be limited once the OxRRAM cell is switched to the low resistance state. At the beginning of the write operation (SET), the OxRRAM memory is in a high resistance state (HRS). Thus, most of the applied voltage $V_{App}$ between the resistance and the memory in series ends up at the terminals of the memory element (i.e. the voltage $V_R$ at the terminals of the resistance is negligible in comparison with the voltage $V_{Ox}$ at the terminals of the memory). When the voltage at the terminals of the OxRRAM memory becomes sufficient (i.e. higher than the threshold voltage VSET), the switching occurs (switchover from the HRS mode to the LRS mode) and the current quickly increases. The voltage at the terminals of the series resistance R increases to "support" the extra voltage. This decrease in the voltage at the terminals of the memory cell thus limits the current increase in the memory.

The use of a series transistor (illustrated in FIG. 4) is very close to the use of the series resistance R. In the same way, upon writing, the current increase causes an increase in the voltage at the terminals of the series transistor. The benefit of using a transistor with respect to a series resistance is that it enables to control the limitation level using the gate voltage. The higher the gate voltage, the higher the saturation current. The transistor thus acts as a means for adjusting the current limitation in the OxRRAM memory.

One way for developing OxRRAM and CBRAM memories is information retention, that is the retention of the "HRS" state and the "LRS" state. It is attempted to improve the stability over time of the insulating and conducting ON states.

It has been demonstrated that the current limitation used during the SET write operation has a strong influence on the information retention performance.

Thus, in the paper "Improvement of data retention in HfO2/Hf 1T1R RRAM cell under low operating current" (Chen Y. Y. et al.—IEEE 2013), it is shown that the current limitation during the SET write operation has a high influence on the retention performance: the current limitation degrades the retention performance. In other words, a memory cell written with a current limitation IC1 has a better retention stability than when it is written with a current limitation IC2 lower than IC1. A decrease in the current limitation during the write operation produces LRS states with a higher resistance and a lower stability (i.e. a quicker increase in the resistance and thus a loss of information). This phenomenon is illustrated in FIG. 5 which represents the evolution of the current at a given voltage of 0.1V passing through a memory cell once written in a LRS state as a function of time, this evolution being obtained with two different current limitations: 40 µA and 10 µA. This evolution thus represents the evolution of the resistance of the LRS state as a function of time. The cell written with a limitation of 40 μA has a better stability than that written with a limitation of 10 μA (all the other experimental conditions being otherwise equal) and the SET initial resistance with a limitation of 40 μA is higher than the SET initial resistance with a limitation of 10 μA. The retention performance of the LRS state thus depend on the current limitation and thus on the level of the LRS resistance when writing.

Besides, it has been shown (cf. paper "Temperature impact (up to 200° C.) on performance and reliability of HfO2-based RRAMs" (Cabout T. et al.—IEEE 2013)) that the programming temperature of the memory (i.e. the temperature of the memory when the SET or RESET operation is made) has a very little effect on the resistance levels of the LRS and HRS states of these memories. The curves of FIG. 6 represent the evolution of the initial resistances at the LRS (bottom curve) and HRS (top curve) states as a function of the programming temperature applied (respectively during the SET and RESET operations). It is observed on these curves that the temperature has nearly no influence on the resistance levels. The resistance of the LRS state is thus the same regardless of the write temperature. It will be noted that the same is true for the resistance of the HRS state.

SUMMARY

Within this context, an aspect of the invention aims in particular at providing a method for determining programming parameters for programming an OxRRAM or CBRAM time resistive random access memory offering an improved retention stability.

To that end, a first aspect of the invention thus relates to a method for determining programming parameters for programming a resistive random access memory switching from an insulating OFF (High resistive state) state to a conducting ON (Low resistive state) state, the memory comprising first and second electrodes separated by a layer of an electrically insulating material, and switching from the insulating OFF state to the conducting ON state by applying a threshold voltage between the first and second electrodes, the current flowing in the memory after switching from the insulating OFF state to the conducting ON state being limited by current limiting means, the method comprising the following steps of:
  determining retention curves representing the increase in the conducting ON state resistance as a function of time, each retention curve being determined for a given programming temperature and a given current limitation;
  determining a retention failure time for each of the retention curves;
  determining curves representing the decrease in the retention failure time as a function of the programming temperature, each curve being determined for a given current limitation;
  for at least one given programming temperature, determining, from the curves representing the decrease in the retention failure time as a function of the programming temperature, a current limiting value to be applied to the resistive random access memory in order to obtain a target retention failure time.

The present invention results from the surprising observation, subsequently described in detail, that the programming temperature to which is subjected the resistive random access memory when written (i.e. SET operation enabling the memory to switch from its HRS highly resistive state to its LRS lowly resistive state) has a sharp influence on the retention performance. Thus, writing at a high programming temperature will offer degraded retention performance in comparison with writing made at a less high programming temperature. This observation is all the more surprising that, as mentioned above, the resistance level of the memory when writing does not depend on the programming temperature whereas the retention performance depends on this resistance level. From the observation that some applications (in particular in the car industry) require to maintain satisfactory retention performance irrespective of the programming temperature, the method according to an embodiment of the invention enables a possible degradation of the retention performance related to an increase in the programming temperature to be compensated by choosing a suitable current limitation value to ensure this compensation.

By target retention failure time, it is meant a failure time determined from a predetermined criterion; in the initial state (t=0), that is immediately after the write operation has been applied, the resistance $R_{ON}$ of the memory in the "LRS" state is minimum. Then, over the course of time, the resistance in the "LRS" state increases. The predetermined criterion consists for example in defining a resistance threshold beyond which it is considered that the information retention is no longer ensured. This threshold resistance is reached after some retention period of time which will be identified as being the retention failure time. From this threshold, it is considered that the memory is in a failure state. For example, and in a non-limiting way, it could be considered that the information in the memory cell is lost when its resistance has increased by a factor of 2 with respect to its initial resistance $R_{ON}$ just after programming (t=0).

In addition to the characteristics just discussed in the previous paragraph, the method according to a first aspect of the invention can have one or more complementary characteristics from the following ones, considered alone or according to all the technically possible combinations:
  according to a first alternative, the method includes a step of measuring the programming temperature before the write operation allowing the resistive random access memory to switch from an insulating OFF state to a conducting ON state, a current limiting value being determined for each measured programming temperature so as to obtain a substantially constant target retention failure time regardless of the measured temperature value in a given temperature range;
  according to a second alternative, the programming temperature ranges in a given temperature range, the method including a step of determining a single current limiting value corresponding to the upper bound of the given temperature range so as to obtain a target retention failure time at the upper bound, the single limiting value being also applied to the resistive random access memory for lower temperatures within the given temperature range;
  determining the retention curves representing the increase in the conducting ON state resistance as a function of time for a given programming temperature and a given current limitation is performed by experimental measurements obtained on one or more resistive random access memories having characteristics identical to the resistive random access memory to be programmed;
  according to an embodiment, the resistive random access memory to be programmed is an OxRRAM type memory;
  according to another embodiment, the resistive random access memory to be programmed is a CBRAM type memory;

the method according to an embodiment of the invention can include a step of determining, for the target retention failure time, a plurality of couples of programming temperature values associated with a current limitation; in this case, the method can also include a step of determining a curve representing the increase in the current limitation as a function of the programming temperature.

An aspect of the present invention is also to provide a computer program product including components for implementing a method according to the invention.

Embodiments of the invention and their different applications will be better understood upon reading the description that follows and examining the accompanied figures.

BRIEF DESCRIPTION OF THE FIGURES

The figures are presented by way of indicating and in no way limiting purposes of the invention.

DETAILED DESCRIPTION

Unless otherwise indicated, a same element appearing in different figures has a single reference.

Figure 1:
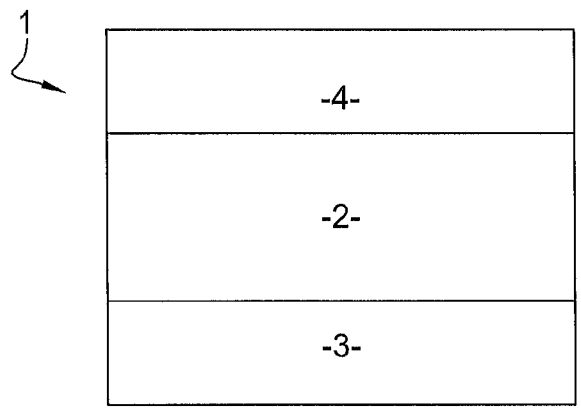
FIG. 1 schematically illustrates an OxRRAM or CBRAM type memory device.
Figure 2:
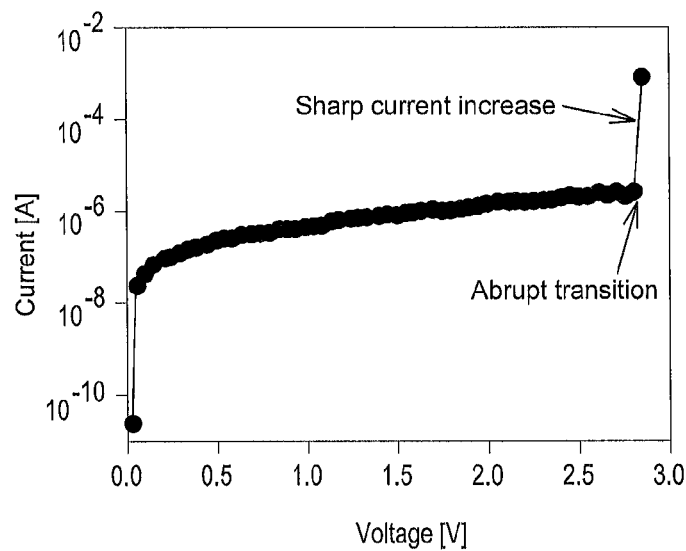
FIG. 2 illustrates the abrupt transition from the high resistance state to the low resistance state during the write operation of an OxRRAM or CBRAM type memory device.

The method according to an embodiment of the invention will be described in more detail in the following in the case of an OxRRAM memory (or "Oxide RRAM") including an active area based on an oxide-based active material such as a binary oxide of a transition metal M (MxOy) surrounded by two metal electrodes (cf. FIG. 1). Thus, this is a M-O-M (Metal-Oxide-Metal) structure based on the resistance change of the oxide layer which switches from a highly resistive state HRS to a lowly resistive state LRS when a sufficient write voltage VSET is applied to the terminals of the electrodes and which switches from a lowly resistive state LRS to a highly resistive state HRS when a sufficient write voltage RESET is applied to the terminals of the electrodes. There is a high number of binary oxides having the capability to reversibly change its resistance. These memories can be bipolar (VSET and VRESET voltages of an opposite sign) or unipolar (VSET and VRESET of the same sign); they can also operate in some cases in both modes (bipolar and unipolar). The OxRRAM memory set out below is a TiN/Ti/HfO2/TiN type memory (thus an upper electrode formed by a TiN/Ti bilayer, an active storage region of HfO2 oxide and a lower electrode of TiN), this example being given by way of purely illustrating and in no way limiting purposes, the method according to an embodiment of the invention being likely to be applicable to any type of OxRRAM memory (for example, a TiN/Hf/HfO2/TiN structure, or a Ti/HfO2/TiN structure or even a Pt/TiO2/Pt structure). The method according to an embodiment of the invention is also applicable to CBRAM type memories having a solid electrolyte provided between an electrode forming an inert cathode and an electrode including an ionisable metal portion (versus OxRRAM type memories the metal electrodes of which are chosen to be poorly ionisable). An example of CBRAM memory is for example formed by a stack including a solid electrolyte, for example based on a doped chalcogenide (ex. GeS) or oxide (ex. $Al_2O_3$) provided between a lower electrode, for example of Pt, forming an inert cathode, and an upper electrode including a ionisable metal portion, for example copper, forming an anode.

As mentioned above, an aspect of the present invention relies on the observation that, even if the programming temperature has no effect on the resistance of the LRS state, it modifies the stability of this state (and thus the information retention performance). Thus, after a high temperature writing, the retention performance is degraded. As for some applications (for example in the automotive field), the high temperature writing is desirable, an embodiment of the invention aims at providing a method for maintaining the retention performance constant or at least higher than a given threshold, irrespective of the programming temperature.

Figure 7:
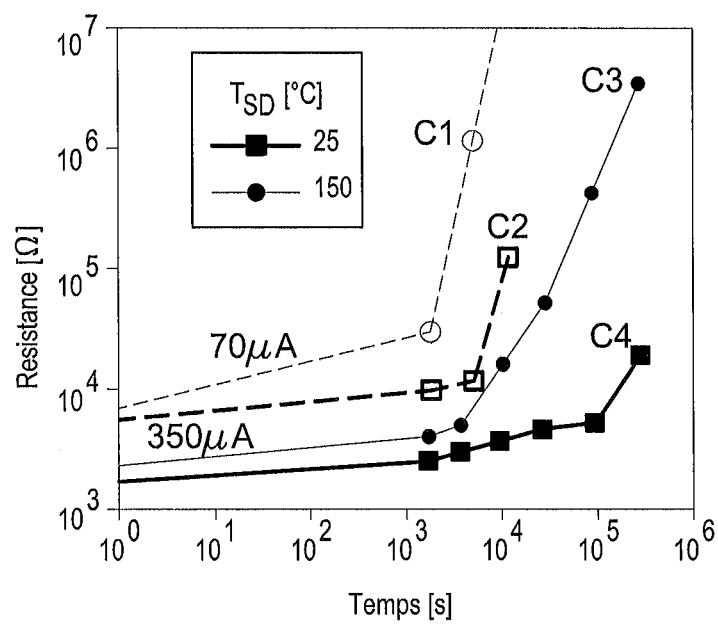
FIG. 7 represents the evolution of the resistance of an OxRRAM memory in the LRS state as a function of time for different programming conditions.

The phenomenon underlying the programming method according to the invention is illustrated in FIG. 7 which shows, for a TiN/Ti/HfO2/TiN type OxRRAM memory, the retention of the "LRS" state represented by the evolution of the resistance of the memory in this state, as a function of time.

FIG. 7 gives four examples of curves C1, C2, C3 and C4 of the retention of the "LRS" state, each of which is obtained with different initial programming conditions (couple of initial conditions including a current limitation value and a programming temperature value):

Curve C1 is obtained with a current limitation of 70 µA and a programming temperature of 150° C.;
Curve C2 is obtained with a current limitation of 701 µA and a programming temperature of 25° C.;
Curve C3 is obtained with a current limitation of 350 µA and a programming temperature of 150° C.;
Curve C4 is obtained with a current limitation of 350 µA and a programming temperature of 25° C.

Generally, irrespective of the curve C1, C2, $C_3$, or C4 in the initial state (t=0), that is immediately after the conducting filament has been formed, the resistance $R_{ON}$ of the memory in the "LRS" state is minimal. Then, over the course of time, the resistance in the "LRS" state increases.

In this FIG. 7, it is thus observed, in a logarithmic scale, the retention curves for two current limitations (70 µA and 350 µA) and for two programming temperatures (25° C. and 150° C.). In other words, starting from a same sample memory, at t=0, the latter switches from a HRS state to a LRS state with four different couples of programming conditions; the programming conditions are:

the programming temperature at which the memory is written;

the current limitation (compliance) applied thereto.

Figures 3, 4:
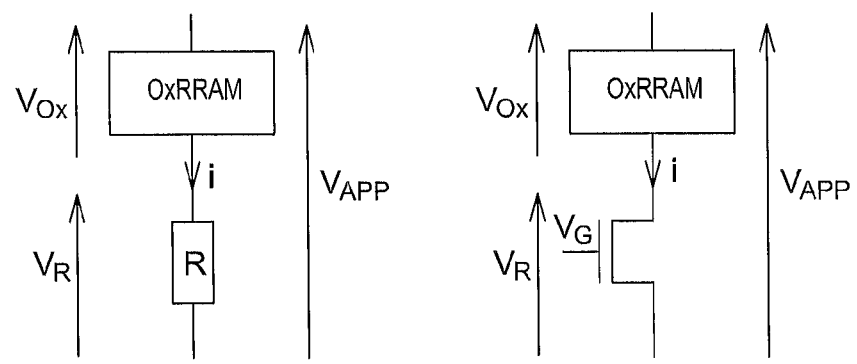
FIG. 3 schematically illustrates the current limitation passing through an OxRRAM memory by the use of a series resistance.
FIG. 4 schematically illustrates the current limitation passing through an OxRRAM memory by the use of a series transistor.
Figure 5:
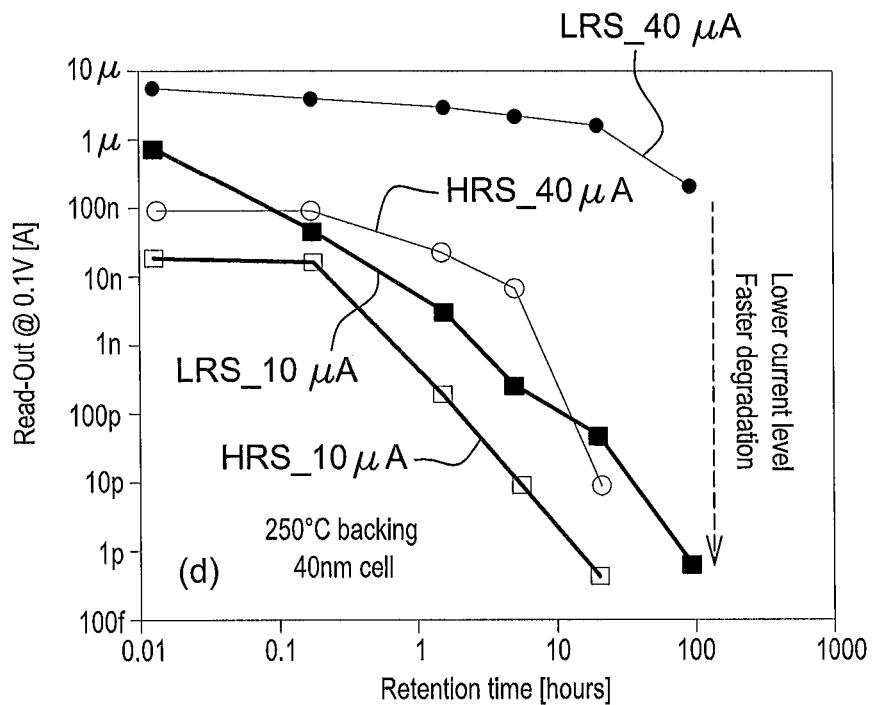
FIG. 5 represents the evolution of the current in an OxRRAM memory once written as a function of time for two different current limitations.
Figure 6:
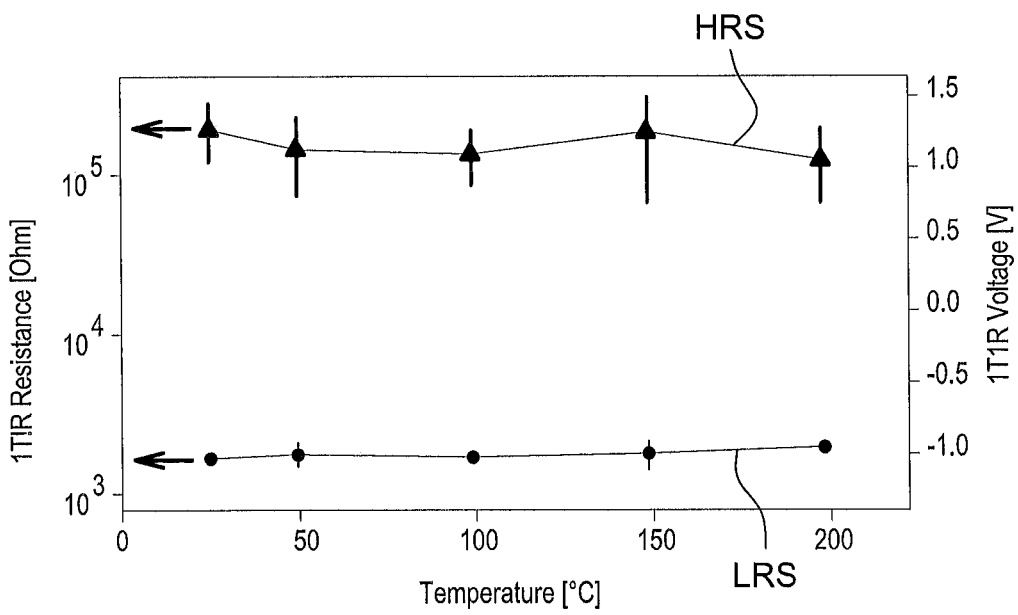
FIG. 6 represents the evolution of the initial resistances in the LRS and HRS states as a function of the programming temperature applied.

It is reminded that the current increase is limited by a compliance up to some value in order to obtain a low resistance state while maintaining a memory device safe (avoiding a definitive oxide breakdown). The current limitation desirable during the write operation is made by current limiting device(s) in the memory consisting for example in using a transistor in series with the memory (cf. FIG. 4): the current limitation is then adjustable via controlling the gate voltage of the transistor.

Once it is written (i.e. once switching to the LRS state is ensured), the memory is then placed at a given temperature (so-called retention temperature) and the evolution of the resistance as a function of time is measured. It will be noted that the retention temperature (herein equal to 250° C.) can be different from the programming temperature. A retention temperature higher than the operating temperature of the memory foreseen by the industrial specification to be able to observe more quickly an information retention failure is often used.

In accordance with the aforesaid state of the art, it is observed in FIG. 7 that the LRS states written with a low current limitation (i.e. 70 μA) are less stable (dashed curves C1 and C2) and have a higher initial resistance.

Moreover, also in accordance with the state of the art, it is observed that the write temperature has no influence on the initial resistance value (curves C1 and C2 respectively obtained at 150° C. and 25° C. for a same limitation of 70 μA have the same resistance value at the initial instant; likewise, curves C3 and C4 respectively obtained at 150° C. and 25° C. for a same limitation of 350 μA have the same resistance value at the initial instant).

On the other hand, it is observed that even if the initial states have the same resistance, the stability is degraded when the cell is programmed at a high programming temperature (150° C.). In other words, the memory according to curve C1 loses information more quickly than the memory according to curve C2 (with a same current limitation and an identical initial resistance value) and the memory according to curve C3 loses information more quickly than the memory according to curve C4.

Therefore, it is observed that the high temperature programming drops retention stability whereas the increase of the limitation current rises it.

The programming method according to an embodiment of the invention takes advantage of the above observation to determine a suitable current limitation to control the retention performance.

Figure 8:
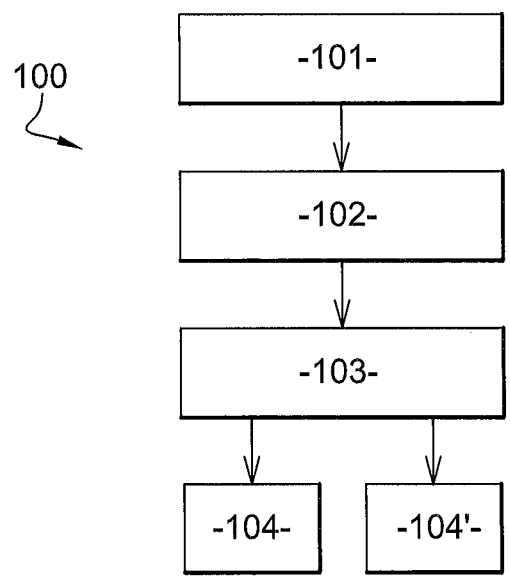
FIG. 8 illustrates different steps of the programming method according to an embodiment of the invention.

The different steps of the method 100 according to the invention are illustrated in FIG. 8.

Figure 9:
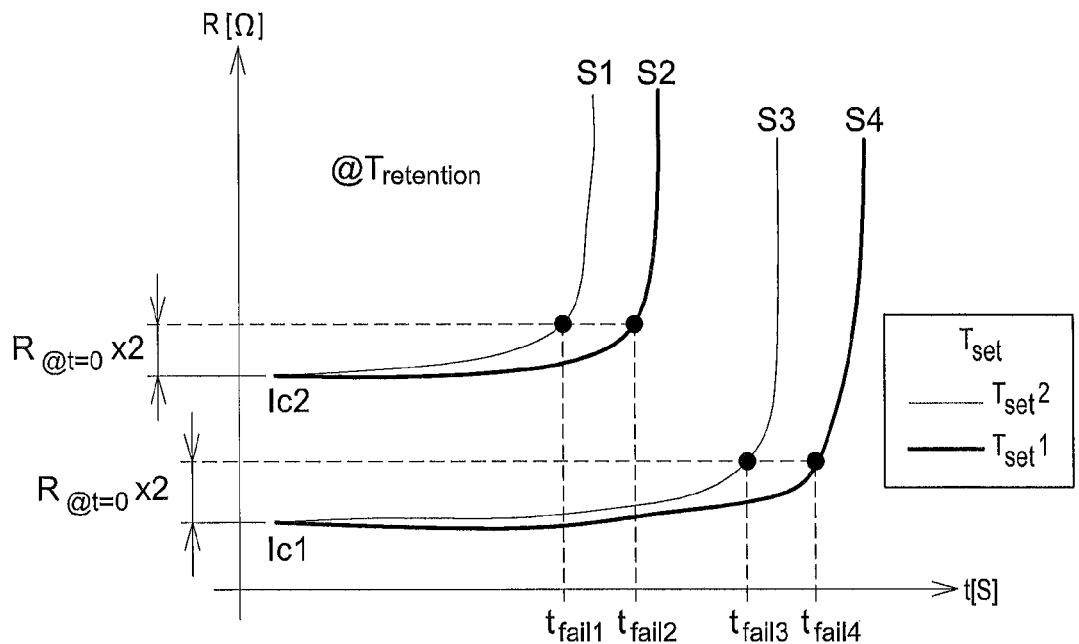
FIG. 9 represents the evolution of the resistance of an OxRRAM memory in the LRS state as a function of time for different programming conditions as well as the determination of the retention failure time.

The first step 101 of the method according to the invention will consist in determining retention curves representing the increase in the resistance in the conducting ON state LRS as a function of time, each retention curve being determined for a given programming temperature and a given current limitation; all the curves are preferentially obtained with a same retention temperature Tretention higher than the operating temperature of the memory foreseen by industrial specifications so as to be able to observe more quickly an information retention failure. The four curves C1 to C4 of FIG. 7 are examples of such curves. FIG. 9 also represents four retention curves S1, S2, S3 and S4 aiming at generally illustrating the method according to the invention.

The curve Si is obtained with a current limitation equal to IC2 and a programming temperature of Tset2 (150° C.);

The curve S2 is obtained with a current limitation equal to IC2 and a programming temperature of Tset1 (25° C.);

The curve S3 is obtained with a current limitation equal to IC1 and a programming temperature of Tset2 (150° C.);

The curve S4 is obtained with a current limitation equal to IC1 and a programming temperature of Tset1 (25° C.);

As previously mentioned, it is observed that the current limitation IC1 strictly higher than the current limitation IC2 enables the retention stability loss upon using the programming temperature Tset2 strictly higher than the programming temperature Tset1 to be compensated for.

It will be appreciated that the method according to an embodiment of the invention involves the obtaining of a plurality of curves corresponding to numerous different couples (IC, Tset), the curves S1 to S4 only being herein given by way of purely illustrating purpose.

Step 101 is experimentally performed by using one or more reference OxRRAM memories; in the case where several memories are used, it should be suitable to select reference memories having the same characteristics in terms of materials and structure. The programming method according to an embodiment of the invention will then be used to program memories of the same type as the memory(ies) on which the experimental measurements have been made.

The second step 102 of the method according to an embodiment of the invention will then consists in determining a retention failure time for each of the retention curves; to do this, it is suitable to choose a criterion for obtaining a failure time. This criterion is an arbitrary criterion and the invention is absolutely not restricted to a particular criterion. In the following, the criterion of an increase in the initial resistance (SET resistance at t=0s) by a factor of 2 will be used. Thus, it is considered that information in the memory is lost when its resistance has increased by a factor of 2 with respect to its initial resistance just after it is programmed (at t=0s).

Thus, for each curve S1, S2, S3, and S4, the retention failure times are extracted (i.e. the time desired for the resistance to switch from a value R(t=0) to a value R(t=0)×2). Four failure times tfail1, tfail2, tfail3, and tfail4 respectively correspond to curves S1, S2, S3 and S4 and thus to the programming conditions (IC2, Tset2), (IC2, Tset1), (IC1, Tset2), and (IC1, Tset1).

Figure 10:
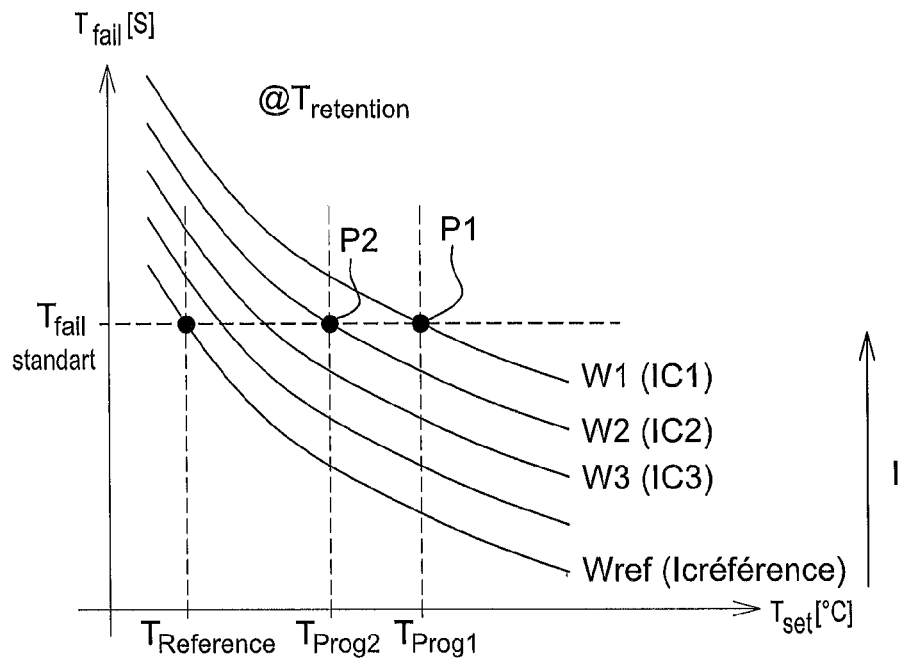
FIG. 10 represents the evolution of the retention failure time as a function of the programming temperature for different current limitations.

According to the step 103 of the programming method according to an embodiment of the invention, the retention failure times determined during the previous step 102 will be used to place them on a curve representing the evolution of the retention failure time as a function of the programming temperature for different current limitations. FIG. 10 thus represents a plurality of curves representing the evolution of the retention failure time as a function of the programming temperature for different current limitations; by way of example, the curve W1 corresponds to the evolution of the retention failure time as a function of the programming temperature for a current limitation IC1; likewise, the curve W2 corresponds to the evolution of the retention failure time as a function of the programming temperature for a current limitation IC2; the curve W3 corresponds to the evolution of the retention failure time as a function of the programming temperature for a current limitation IC3 and the curve Wref corresponds to the evolution of the retention failure time as a function of the programming temperature for a reference current limitation ICreference.

As mentioned above, a decrease in the retention failure time when the programming temperature increases is generally observed (i.e. irrespective of the current limitation value). It is also observed that the curve W1 is above the curve W2 which itself is above the curve W3 which itself is above the curve Wref: this arrangement is explained by the fact that the current IC1 is higher than the current IC2 which is itself higher than the current IC3 itself higher than the reference current ICreference.

Use specifications of OxRRAM or CBRAM type memories are varied according to the application fields and are more or less restrictive. Thus, specifications can demand that memories operate with some retention time on a given temperature range: by way of illustrating purposes, a retention of 1 to 3 years can be demanded on a range from 0° C. to 40° C. for consumer market memories or a longer retention (in the order of 15 years) in the automotive field with a very wide temperature range (for example from −40° C. to 150° C.).

Hence, according to a first embodiment, if the user wants to have the same retention stability for one or more given write temperatures (for example, $T_{Prog1}$ and $T_{Prog2}$), the programming method will include a step 104 consisting in drawing a horizontal straight line on the curves of FIG. 10 corresponding to the target retention failure time ($t_{fail\_standard}$) he/she desires to obtain (for example for a programming temperature $T_{reference}$ and the current limitation $IC_{reference}$) and drawing a vertical straight line corresponding to each writing temperature considered (herein $T_{Prog1}$ and $T_{Prog2}$).

The intersection of both these straight lines gives the wanted operating point to obtain the same retention performance (i.e. have the same retention failure time irrespective of the programming temperature of the temperature range foreseen by the specifications). It is then sufficient for the user to use the current limitation corresponding to the curve passing through this point. Herein, for both programming temperatures $T_{Prog1}$ and $T_{Prog2}$, the two programming currents IC1 and IC2 corresponding to both operating points P1 and P2 are respectively obtained.

Figure 11:
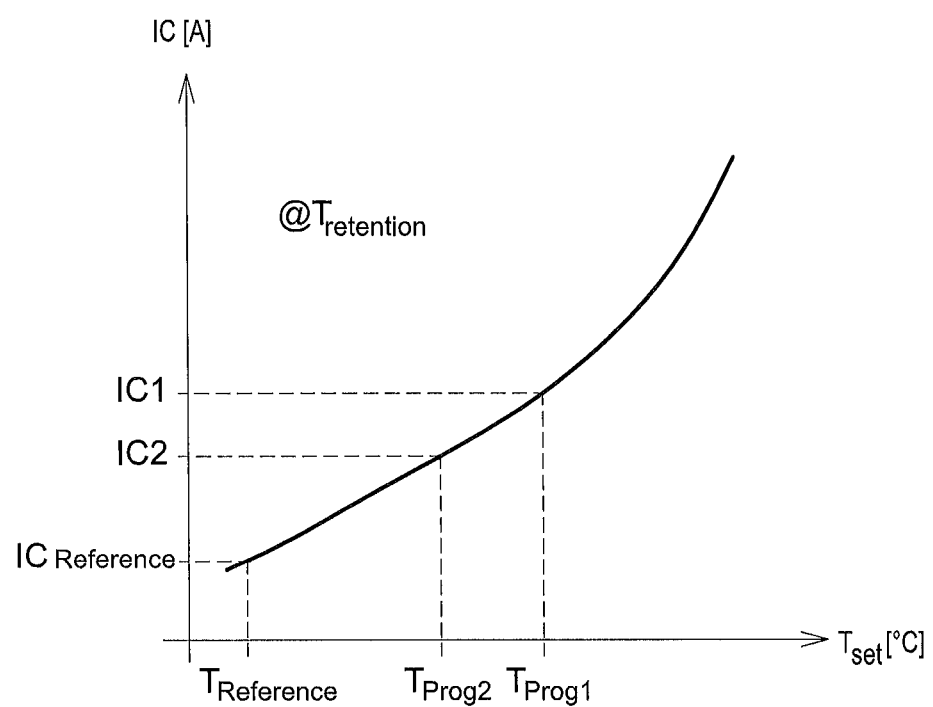
FIG. 11 represents the evolution of the current limitation as a function of the programming temperature for a given target retention time.

All these operating points can then be used to represent the evolution of the current limitation as a function of the programming temperature for a same given target retention time. This curve is illustrated in FIG. 11.

The implementation of this first embodiment thus assumes to measure the temperature of the memory to be programmed; depending on the temperature measured and if the target retention time is known, the limitation current to be applied to the memory is deduced therefrom; this current limitation is for example adjusted via the gate of a transistor in series with the memory. According to this embodiment, the device integrating the memory(ies) to be programmed is equipped with temperature measuring components enabling a temperature measurement to be provided upon programming the memory(ies) and therefore the operating point to be determined (i.e. the current limitation associated with the programming temperature) to obtain the target retention time searched for.

According to an alternative of the first embodiment, the user can decide to have a satisfactory retention stability (and not necessarily identical) for one or more given write temperatures; to do this, the programming method will include a step 104' consisting in choosing the maximum temperature of the temperature range desired by the specifications and then determining, from the curves of FIG. 10, the current limitation to be applied, to obtain a wanted retention time; this current limitation thus determined will be applied to the memory over the entire temperature range; in other words, the current limitation will be "oversized" so as to have a wanted retention time in the maximum programming temperature condition; by way of illustrating purposes, in the range $[T_{reference}-T_{prog2}]$, to obtain a target retention failure time ($t_{fail\_standard}$), the temperature $T_{Prog2}$ is set; the current limitation IC2 to be applied is deduced therefrom. This current limitation IC2 will be applied to the memory irrespective of the temperature in the range $[T_{reference}-T_{prog2}]$.

Having described and illustrated the principles of the invention with reference to various embodiments, it will be recognized that the various embodiments can be modified in arrangement and detail without departing from such principles. It should be understood that the different devices, programs, processes, or methods described herein, are not related or limited to any particular type of computing environment, unless indicated otherwise. Various types of specialized computing environments may be used with or perform operations in accordance with the teachings described herein. Elements of embodiments shown in software may be implemented in hardware and vice versa.

One or more physical devices, physical processors or physical processing devices (including hardware circuitry) may be configured to carry out the steps of the methods described herein. For example, the one or more devices, processors or processing devices may be configured to execute one or more sequences of one or more machine executable instructions contained in a main memory to implement the method(s) or function(s) described herein. Execution of the sequences of instructions contained in a main memory causes the processor to perform at least some of the process steps or function(s) of the elements described herein. One or more processors in a multi-processing arrangement may also be employed to execute the sequences of instructions contained in a main memory or computer-readable medium. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to a processor for execution. Such a medium is non-transitory and may take many forms, including but not limited to, non-volatile media, volatile media, and transmission media. Non-volatile media include, for example, optical or magnetic disks. Volatile media include dynamic memory. Transmission media include coaxial cables, copper wire and fiber optics. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor for execution.

Computer programs comprising machine executable instructions for implementing at least one of the steps of the methods described herein can be implemented by one or more computers comprising at least an interface, a physical processor and a non-transitory memory (also broadly referred to as a non-transitory machine readable or storage medium). The computer is a special purpose computer as it is programmed to perform specific steps of the method(s) described above. The non-transitory memory is encoded or programmed with specific code instructions for carrying out the above method(s) and its/their associated steps. The non-transitory memory may be arranged in communication with the physical processor so that the physical processor, in use, reads and executes the specific code instructions embedded in the non-transitory memory. The interface of the special purpose computer may be arranged in communication with the physical processor and receives input parameters that are processed by the physical processor.

It will be appreciated by one skilled in the art that the disclosed arrangements and methods described herein represent a solution to the technological problem described above and currently faced by designers for programming an OxR-RAM or CBRAM time resistive random access memory offering an improved retention stability.

The invention claimed is:

1. A method for determining programming parameters for programming a resistive random access memory switching from an OFF state to an ON state, the memory comprising first and second electrodes separated by a layer of an electrically insulating material, and switching from the OFF state to the ON state by applying a threshold voltage between the first and second electrodes, the current flowing in the memory after switching from the OFF state to the ON state being limited by a current limiting device, the method comprising:
   determining retention curves representing an increase in the ON state resistance as a function of time, each retention curve being determined for a given programming temperature and a given current limitation;
   determining a retention failure time for each of the retention curves;
   determining curves representing a decrease in the retention failure time as a function of the programming temperature, each curve being determined for a given current limitation;
   for at least one given programming temperature, determining, from the curves representing the decrease in the retention failure time as a function of the programming temperature, a current limiting value to be applied to the resistive random access memory in order to obtain a target retention failure time.

2. The method according to claim 1, further comprising measuring the programming temperature before a write operation allowing the resistive random access memory to switch from an OFF state to an ON state, a current limiting value being determined for each measured programming temperature so as to obtain a substantially constant target retention failure time regardless of the measured temperature value in a given temperature range.

3. The method according to claim 1, wherein the programming temperature ranges in a given temperature range, the method including determining a single current limiting value corresponding to an upper bound of the given temperature range so as to obtain a target retention failure time at the upper bound, the single limiting value being also applied to the resistive random access memory for lower temperatures within the given temperature range.

4. The method according to claim 1, wherein determining the retention curves representing the increase in the ON state resistance as a function of time for a given programming temperature and a given current limitation is performed by experimental measurements obtained on one or more resistive random access memories having characteristics identical to the resistive random access memory to be programmed.

5. The method according to claim 1, further comprising determining, for the target retention failure time, a plurality of couples of programming temperature values associated with a current limitation.

6. The method according to claim 5, further comprising determining a curve representing the increase in the current limitation as a function of the programming temperature.

7. The method according to claim 1, wherein the resistive random access memory is an OxRRAM type memory.

8. The method according to claim 1, wherein said resistive random access memory is a CBRAM type memory.

9. A non-transitory computer-readable medium comprising machine executable instructions which, when run on a computer, carry out the method according to claim 1.

* * * * *